US006603275B2

(12) United States Patent
Ku

(10) Patent No.: US 6,603,275 B2

(45) Date of Patent: Aug. 5, 2003

(54) ELECTRONIC STARTER FOR FLUORESCENT LAMPS

(76) Inventor: Chen-Kuo Ku, Taipei (TW)

( * ) Notice: Subject to any disclaimer, the term of this patent is extended or adjusted under 35 U.S.C. 154(b) by 122 days.

(21) Appl. No.: 09/874,827

(22) Filed: Jun. 5, 2001

(65) Prior Publication Data

US 2002/0180375 A1 Dec. 5, 2002

(51) Int. Cl.[7] .................................................. G03F 1/00

(52) U.S. Cl. ....................... 315/307; 315/101; 315/107; 315/290; 315/309; 362/290

(58) Field of Search .......................... 362/290; 315/307, 315/101, 291, 107, 106, 313, DIG. 517

(56) References Cited

U.S. PATENT DOCUMENTS 4,629,944 A * 12/1986 Maytum et al. ............ 315/207

5,338,110 A * 8/1994 Byun .......................... 315/94

5,616,992 A * 4/1997 Bildgen .................. 315/209 T 6,072,285 A * 6/2000 Chen .......................... 315/307

* cited by examiner

*Primary Examiner*—Sandra O'Shea
*Assistant Examiner*—James W Cranson
(74) *Attorney, Agent, or Firm*—Alan D. Kamrath; Rider Bennett, LLP.

(57) ABSTRACT

An electronic starter for fluorescent lamp has a preheating circuit for controlling the preheating of the fluorescent tube and a power switch and locking circuit for cutting off the current to the preheating circuit. The power switch and locking circuit makes use of the voltage level on the power input to determine the status of the fluorescent tube. A high voltage on the power input represents that the fluorescent tube has failed to turn on in the ignition operation, whereby the power switch and locking circuit thereupon cuts off the current to the preheat circuit, thereby eliminating flickering of the fluorescent tube and so preventing irritation to the eyes, and extending the service life of the lamp.

4 Claims, 2 Drawing Sheets

ELECTRONIC STARTER FOR FLUORESCENT LAMPS

BACKGROUND OF THE INVENTION

1. Field of the Invention

The present invention pertains to an electronic starter for fluorescent lamps, in particular, an electronic starter employing a small quantity of components and being capable of adapting to different power specifications without having to change the circuitry.

2. Description of Related Art

The starting device, a critical component for ignition of fluorescent tubes, operates in conjunction with the ballast to produce high inverted potential necessary for turning on a fluorescent tube, which is the operating theory behind the conventional fluorescent lamps. The starting device has been transformed over the years from the mechanical type used in earlier days to the latest electronic type, the latter being capable of igniting the fluorescent tube in much shorter a time interval than the mechanical type. Most electronic starters now found on the market are based on the half-wave rectification model, such that the fluorescent tube often has to be ignited many times before it is successfully actuated. In spite of its relatively short preheating time required for the ignition, this could lead to the blackening of the fluorescent tube and also reduce the service life of the tube. Furthermore, the starters sometimes fail to ignite a fluorescent tube due to an insufficient preheating time. To correct the problem, a full-wave rectification starter is proposed to replace the conventional type of starters.

There is shown in FIG. 2 a schematic diagram of a conventional electronic starter employing a full-wave rectification connected to a fluorescent tube (51) and an AC power input (53), wherein the electronic starter comprises a bridge rectifier (50), a locking circuit (56), a power switch circuit (55), and a preheating circuit (54).

Both ends of the AC power input (53) are respectively connected to two input terminals of the fluorescent tube (51), where a ballast (52) is connected between one terminal of the AC power input (53) and one input terminal of the fluorescent tube (51). Two output terminals of the fluorescent tube (51) are respectively connected to two input terminals of the bridge rectifier (50) in the electronic starter, and two output terminals of the bridge rectifier (50) are respectively connected to the locking circuit (56), and the locking circuit (56) is connected through the power switch circuit (55) to the preheating circuit (54).

In the power switch circuit (55), when AC power for the electronic starter comes in through the bridge rectifier (50) after converting to DC, transistor Q3 is activated and transistor Q4 is cut off due to lower resistance at resistor R6 than R7. Because the resistance at resistor R4 is lower than R1, and the resistance at resistor R5 is lower than R2, after a certain time, the transistor Q2 is activated and transistor Q3 is then cut off. At the same time, transistor Q4 is activated and the voltage level at the drain of the transistor Q4 is dropped, thus the incoming current path for preheating the fluorescent tube (51) is completed. When a capacitor C1 at the base of the transistor Q1 is charged up to the conducting threshold voltage of the transistor Q1, the transistor Q1 becomes activated and transistor Q2 is cut off, thereafter transistor Q3 is activated again while transistor Q4 is cut off. Since transistor Q4 is disabled, the current path is cut off, causing the ballast (52) to produce high inverted potential for activating the fluorescent tube (51). After the fluorescent tube (51) is turned on, the locking circuit (56) can lock in the operating status of the power switch circuit (55).

Having described the conventional circuit design above, it is understood said electronic starting device employs more than two transistors and a MOSFET type transistor to control the preheating time and locking the operating status after igniting the fluorescent tube (51). Since a large number of components are required in its internal circuit, that means the cost is accordingly high for manufacturers of these starting devices. Eventually these starting devices would not be able to compete with other products of similar type due to its cost is higher than the other products. Also, the type of resistors and capacitors chosen decides the time constant for the transistor operation. Because each transistor has its own time constant, discrepancy in firing among transistors would easily occur, resulting in tube flickering.

SUMMARY OF THE INVENTION

The main object of the present invention is to provide an electronic starter that uses few components reducing the cost of the circuit and prevents the flickering of the fluorescent tube during ignition.

To achieve the above-mentioned objects, the electronic starter under the present invention comprises a full-wave rectification circuit connected through a fluorescent tube and a ballast to the AC power input, a preheating circuit for controlling the preheating time of the fluorescent tube, a power switch and locking circuit, connected in between the full-wave rectification circuit and the preheating circuit, for cutting off the power to the preheating circuit and locking the status of the preheating circuit in order to prevent flickering during preheating of the tube.

Other objects, advantages, and novel features will become more apparent from the following detailed description when taken in conjunction with the attached drawings.

DETAILED DESCRIPTION OF THE PREFERRED EMBODIMENT

Figure 1:
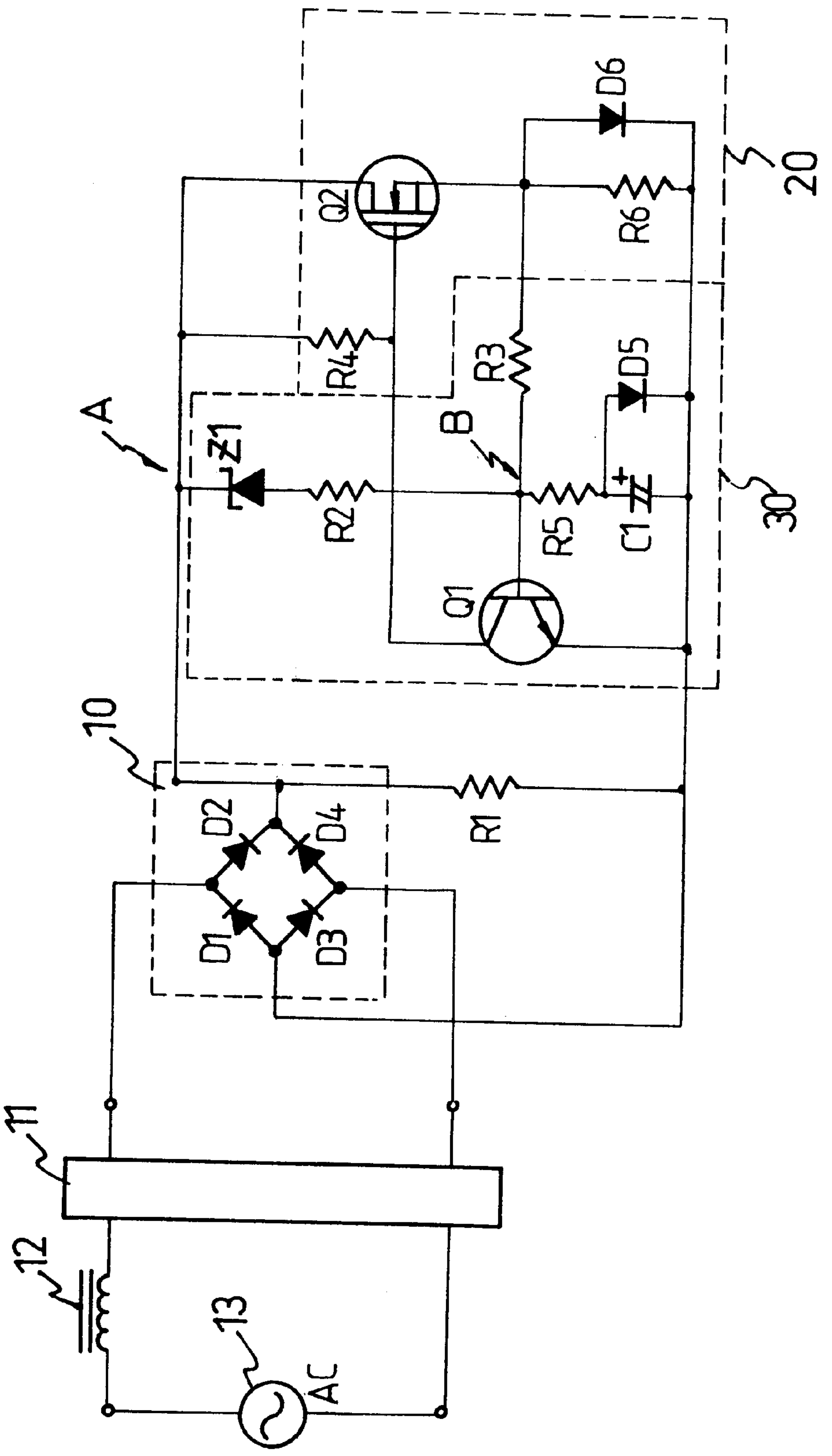
FIG. 1 is a detailed schematic diagram of an electronic starter in accordance with the present invention.
Figure 2:
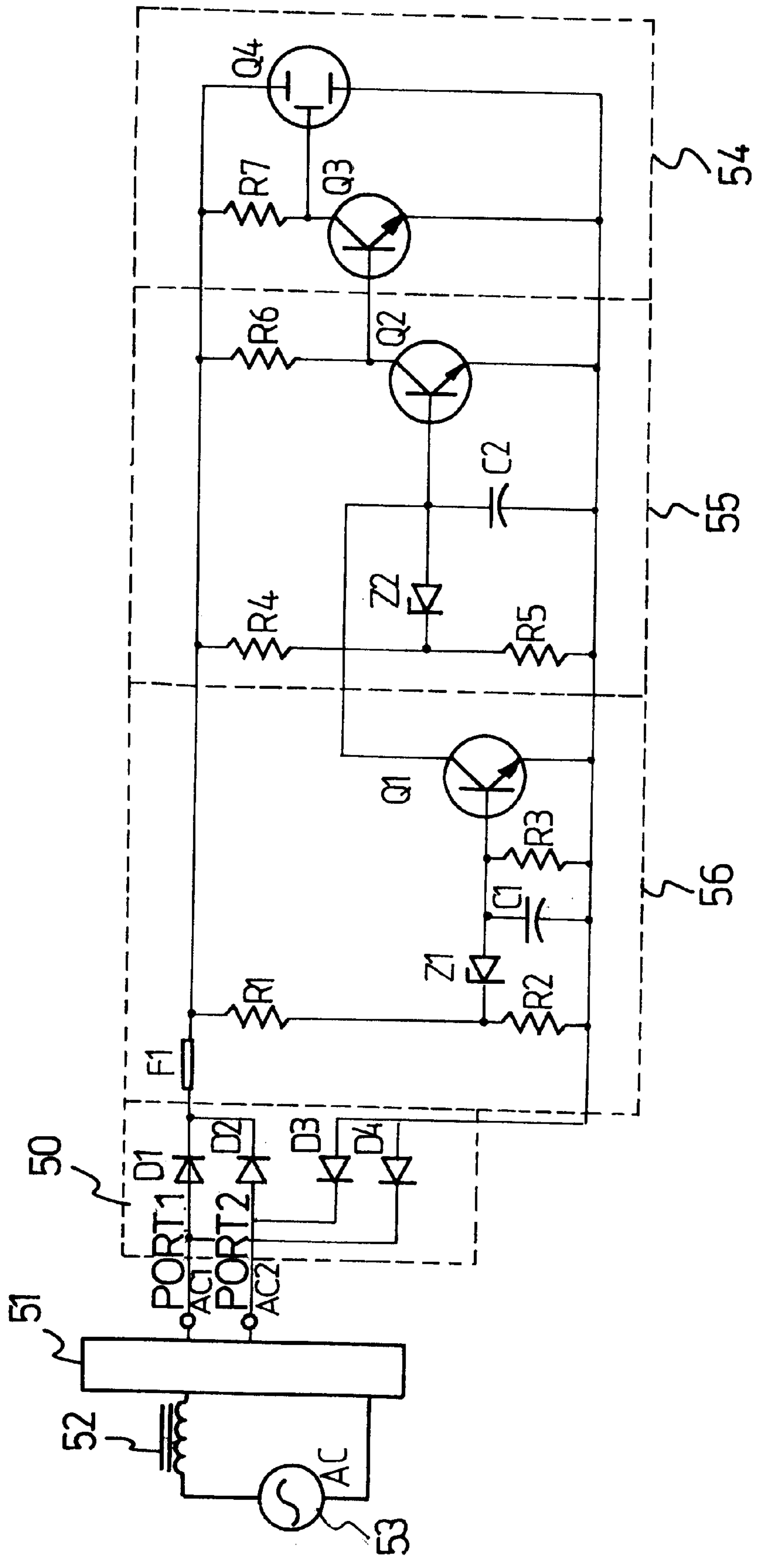
FIG. 2 PRIOR ART
FIG. 2 is the detailed schematic diagram of a conventional electronic starter.

There is shown in the schematic diagram FIG. 1 an electronic starter under the invention adapted to connect to a fluorescent tube (11), a ballast (12) and an AC power input (13). The electronic starter in accordance with the present invention includes a full-wave rectification circuit (10), a preheating circuit (20) and a power switch and locking circuit (30).

Two ends of the AC power input (13) are respectively connected to a first and a second input terminal of the fluorescent tube (11), wherein a ballast is connected between the first terminal of the AC power input (13) and a first input terminal of the fluorescent tube (11). A first and a second output terminal of the fluorescent tube (11) are respectively connected to a first and a second input terminal of the full-wave rectification circuit (10) of the electronic starter. A first and a second output terminal of the full-wave rectification circuit (10) are respectively connected to the preheating circuit (20) and the power switch and locking circuit (30).

The full-wave rectification circuit (10) is mainly formed by a bridge rectifier using four diodes D1~D4, so that AC current from the AC power input (13) is converted to DC current after passing through the full-wave rectification bridge rectifier, the DC current is then fed to the preheating circuit (20) for preheating the fluorescent tube (11).

The preheating circuit (20) comprises a MOSFET transistor Q2, whose drain is connected to the first input of the full-wave rectification circuit (10), and its source is connected through a resistor R6 to the second output terminal of the full-wave rectification circuit (10). The resistor R6 is connected in parallel with a diode D6, where the gate of the MOSFET transistor Q2 is connected through a resistor R4 to the drain of the MOSFET transistor Q2, and further connected to the power switch and locking circuit (30).

The power switch and locking circuit (30) is mainly formed with a transistor Q1, a capacitor C1, a diode D5, a Zener diode Z1 and a plurality of resistors. The collector of the transistor Q1 is connected to the gate of MOSFET transistor Q2, and the base of the transistor Q1 is connected through a resistor R3 to the source of the MOSFET transistor Q2. The first output of the full-wave rectification circuit (10) is connected through the Zener diode Z1 and a resistor R2 to the base of the transistor Q1, and the second output of the full-wave rectification circuit (10) is connected through a resistor R5 and the capacitor C1 to the base of transistor Q1, and the diode D5 is connected in parallel to the capacitor C1.

A detailed circuit analysis of the preferred embodiment is provided below for further insight into the design of the invention.

AC current from the AC power input (13) that passes through the full-wave rectification circuit (10) is transformed to DC, and through resistor R4 to the gate of the MOSFET transistor Q2. When the voltage level at the gate is over 2.5 V, the MOSFET transistor Q2 is conducted, the voltage at a node A is approx. 4V, then the current passes through the resistor R6 and the diode D6 to the preheating circuit (20) to complete the incoming current path for preheating of the fluorescent tube (11).

During the preheating of the fluorescent tube (11), the current passes through the resistor R6 and the diode D6 to produce an approx. 0.9V voltage drop across both ends of the resistor R6, then a current from the resistor R6 charges the capacitor C1 through the resistors R3, R5. Since the voltage at the node A during preheating reaches 4V and the inverted Zener diode Z1 at the node A prevents the current from charging the capacitor C1, the only charge current comes from the resistor R6. Once the base of the transistor Q1 (node B) reaches 0.7V, the transistor Q1 is conducted, and the voltage between the collector and the emitter ($V_{CE}$) drops to 0.1V. Since the collector of the transistor Q1 is connected to the gate of the MOSFET transistor Q2, the MOSFET transistor is cut off thereafter.

Since the ballast (12) is an induction component, the moment the current to the MOSFET transistor Q2 is cut off, basing on the principle of induction Vr=−L (di/dt), the ballast (12) produces extremely high inverted potential Vr, and the extremely high inverted potential Vr will then cause the fluorescent tube (11) to turn on.

When the fluorescent tube (11) gradually wears out after long-time use, the ions on the surface of the filament are depleted, thus making it difficult for the fluorescent tube to release sufficient ions for a successful ignition, and the flickering of the fluorescent tube also presents an irritation to people, but in the present invention the locking function is proposed to correct this phenomenon.

When the fluorescent tube (11) fails to turn on during ignition, high voltage is repeatedly generated at the node A, which is the output terminal of the full-wave rectification circuit (10), and this causes the current to flow through resistors R2, R5 to charge the capacitor C1. When the voltage at the node B reaches the conducting threshold voltage of the transistor Q1, the transistor Q1 is conducted and the MOSFET transistor Q2 is then cut off. Once the MOSFET transistor Q2 is locked in the cut-off condition, preheating of the fluorescent tube (11) will be terminated, thus flickering can be prevented.

In another embodiment, a resistor R1 is used to connect across the first and the second output terminals of the full-wave rectification circuit (10), and each end of the ballast (12) has a capacitor (not shown) fitted thereto, whereby the resistor R1 can act to release the residue electric charges, so that the transistor Q1 and the MOSFET transistor Q2 can be restored to the initial state quickly, thus enhancing the response time for the starter in the invention.

The diode D5 connected in parallel on the capacitor C1 is mainly for limiting the voltage level of C1 to be less than the base voltage required for operating the transistor Q1.

From the foregoing, it can be seen the circuit design under the present invention has the following advantages:

1. The circuitry for the present invention can be performed with relatively fewer components as compared against the conventional electronic starting device, thus reducing the production cost and increasing the competitiveness in product marketing.
2. When the fluorescent tube gradually wears out from long use and flickers, the locking function can keep the tube from flickering thus preventing irritation to people nearby.

What is claimed is:

1. An electronic starter for fluorescent lamps, the electronic starter comprising:

a full-wave rectification circuit having a first output terminal arid a second output terminal for converting an incoming AC current to a DC current to be outputted through the first and second output terminals;

a preheating circuit, herein the DC current is transferred to the preheating circuit that is mainly formed with a MOSFET transistor Q2 having a drain and a gate, wherein the sin of the MOSFET transistor Q2 is connected to the first output terminal of the full-wave rectification circuit for controlling the preheating of the fluorescent tube; and a power switch arid locking circuit, wherein the power switch and locking circuit is mainly formed with a transistor Q1 having a collector connected to the gate of the MOSFET transistor Q2 for cutting off the preheating circuit;

wherein the MOSFET transistor Q2 further as a source connected through a resistor R6 and a diode D6 in parallel to the second output terminal of the full-wave rectification circuit, and the gate of the MOSFET transistor Q2 is connected through a resister R4 to the drain of the MOSFET transistor Q2 and then further to the power switch and locking circuit.

2. The electronic starter as claim in claim 1, wherein the transistor Q1 further has a base connected through a R2 and a Zener diode Z1 to the first output terminal of the full-wave rectification circuit, and the base of the transistor Q1 is further connected through a capacitor C1 to the second output terminal of the full-wave rectification circuit, and then further through a resistor R4 connected to the source of the MOSFET transistor Q2.

3. The electronic starter as claimed in claim 2, wherein a resistor R5 is connected in series between the base of the transistor Q1 and the capacitor C1, and a diode D5 is connected to the capacitor C1 in parallel.

4. The electronic starter as claimed in claim 3, wherein a resistor R1 is connected between the first and the second output terminals of the full-wave rectification circuit.

* * * * *